_United States Patent_ [19]

Gersdorf et al.

[11] Patent Number: 4,987,053
[45] Date of Patent: Jan. 22, 1991

[54] POLYMERIZABLE COMPOUNDS, AND A RADIATION-POLYMERIZABLE MIXTURE CONTAINING SAME

[75] Inventors: Joachim Gersdorf; Klaus Rose, both of Wiesbaden, Fed. Rep. of Germany

[73] Assignee: Hoechst Aktiengesellschaft, Frankfurt am Main, Fed. Rep. of Germany

[21] Appl. No.: 270,351

[22] Filed: Nov. 14, 1988

[30] Foreign Application Priority Data

Nov. 16, 1987 [DE] Fed. Rep. of Germany ....... 3738864

[51] Int. Cl.$^5$ .................. G03C 7/028; G03C 7/09; C08F 2/48; C08J 3/28
[52] U.S. Cl. .................. 430/277; 430/285; 430/275; 430/271; 430/278; 430/288; 430/286; 522/136; 522/138; 522/137; 522/173; 522/117; 522/116; 522/102; 522/100; 560/222; 544/392; 544/399; 546/341
[58] Field of Search .............. 522/136, 138, 137, 173, 522/117, 116, 102, 100; 560/222; 544/392, 399; 546/341; 430/285, 275, 271, 278, 277, 288

[56] References Cited

U.S. PATENT DOCUMENTS

| | | | |
|---|---|---|---|
| 3,417,567 | 12/1968 | Higashimura et al. | 61/36 |
| 3,759,807 | 9/1973 | Osborn et al. | 204/159.23 |
| 4,001,304 | 1/1977 | Nyi et al. | 560/222 |
| 4,054,682 | 10/1977 | Kuesters et al. | 427/54 |
| 4,071,424 | 1/1978 | Dart et al. | 204/159.15 |
| 4,418,138 | 11/1983 | Curtis | 522/116 X |
| 4,666,952 | 5/1987 | Henne et al. | 522/14 |
| 4,772,538 | 9/1988 | Walls et al. | 522/117 X |

OTHER PUBLICATIONS

Patent Abstracts, 74–Radiation Chem., Photochem. vol. 85, 1976, p. 555, 85: 54620a—Japan. Kokai 75,129,214, Oct. 13, 1975.
Chemical Abstract 95: 220727u, 1981.
Chemical Abstract 86: 30443q, 1977.

_Primary Examiner_—Cynthia Hamilton
_Attorney, Agent, or Firm_—Foley & Lardner, Schwartz, Jeffery, Schwaab, Mack, Blumenthal & Evans

[57] ABSTRACT

Compounds of the general formula I

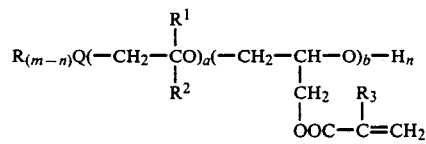

are described in which
Q denotes

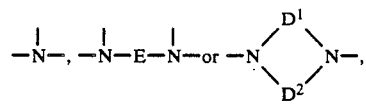

R denotes alkyl, hydroxyalkyl or aryl,
$R^1$ and $R^2$ denote H, alkyl or alkoxyalkyl,
$R^3$ denotes H, methyl or ethyl,
$D^1$ and $D^2$ denote saturated hydrocarbon groups,
E denotes alkylene, cycloalkylene, arylene, saturated or unsaturated heteroyls or a group of the formula II

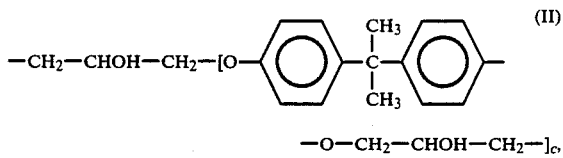

a and b denote integers from 1 to 4.
c denotes an integer from 1 to 3,
m denotes 2, 3 or 4, depending on the valency of Q, and
n denotes an integer from 1 to m, where all radicals of the same definition may be identical to or different from one another.

The compounds are suitable as polymerizable compounds for photopolymerizable mixtures and are distinguished by ready polymerizability in combination with photoinitiators and long shelf lives in the layer.

11 Claims, No Drawings

POLYMERIZABLE COMPOUNDS, AND A RADIATION-POLYMERIZABLE MIXTURE CONTAINING SAME

BACKGROUND OF THE INVENTION

The present invention relates to novel polymerizable compounds containing at least two acrylate or alkacrylate groups in the molecule, and to a radiation-polymerizable mixture, in particular a photopolymerizable mixture, containing these compounds.

Photopolymerizable mixtures which contain acrylates and/ or methacrylates as polymerizable compounds are known. Photopolymerizable mixtures which, in order to increase the photosensitivity, contain certain combinations of photoinitiators and activators, for example combinations of carbonyl group-containing initiators and tertiary amines, are also known. Such mixtures having a synergistic action are described, for example, in DE-A No. 2,602,419, 2,251,048 and 3,331,157 and in U.S.-A Pat. No. 3,759,807. A disadvantage of these mixtures which contain low-molecular-weight amines is that they have a short shelf life since the amines can easily exude or evaporate, in particular from thin coatings.

In JP-A No. 50/129,214, a photopolymerizable mixture is described which contains a tetra(meth)acrylate of a N,N,N',N'-tetrahydroxyalkylalkylenediamine as a polymerizable compound. The tetrafunctional compound functions as a crosslinking agent.

Mixtures are also known which contain triethanolamine trimethacrylate as a crosslinking agent and are described, for example, in Chem. Abstr. 86 (1977), 30443q and 95 (1981), 220 727n. These compounds also tend to diffuse and evaporate out of the coating on relatively long storage and at elevated ambient temperature.

In U.S. patent application Serial No. 173,936 filed Mar. 28, 1988, high-molecular weight polymerizable acrylates and alkacrylates are proposed which contain at least one amino group and at least one urethane group in the molecule.

Summary of the Invention

Accordingly, it is the object of the present invention to provide improved polymerizable acrylate and alkacrylate compounds.

Another object of the present invention is to provide polymerizable compounds suitable for use in radiation-polymerizable mixtures, including photopolymerizable mixtures.

A further object of the present invention is to provide polymerizable mixtures having high radiation sensitivity. Yet another object of the present invention is to provide polymerizable mixtures which retain high radiation sensitivity after relatively long storage.

Still another object of the present invention is to provide a radiation-polymerizable recording material which is highly radiation-sensitive after relatively long storage.

In accomplishing the foregoing objects, there has been provided, in accordance with one aspect of the present invention, a polymerizable compound represented by the formula I

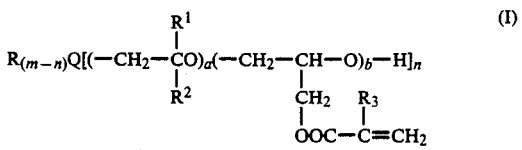

in which
Q denotes

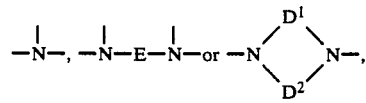

R denotes an alkyl, hydroxyalkyl or aryl group,
$R^1$ and $R^2$ are identical or different, and each denote a hydrogen atom, an alkyl group or an alkoxyalkyl group,
$R^3$ denotes a hydrogen atom, a methyl group or an ethyl group,
$D^1$ and $D^2$ are identical or different, and each denote a saturated hydrocarbon group having 1 to 5 carbon atoms,
E denotes a saturated hydrocarbon group having 2 to 12 carbon atoms, a cycloaliphatic group having 5 to 7 ring members and comprising from zero to two N, O or S atoms as ring members, an arylene group having 6 to 12 carbon atoms, a heterocyclic aromatic group having 5 or 6 ring members or a group of the formula II

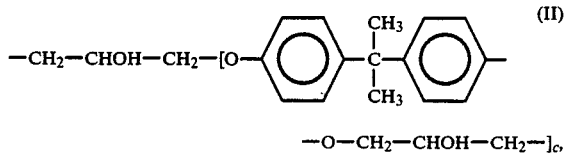

a and b denote integers from 1 to 4,
c denotes an integer from 1 to 3,
m denotes 2, 3 or 4, depending on the valency of Q, and
n denotes an integer from 1 to m,
where all radicals of the same definition may be identical to or different from one another.

In accordance with another aspect of the present invention, there has been provided a radiation-polymerizable composition consisting essentially of (a) a polymeric binder, (b) a compound of said formula I, and (c) at least one compound capable of initiating polymerization of compound (b) under the action of actinic radiation.

In accordance with still another aspect of the present invention, there has been provided a radiation-polymerizable recording material comprising a support and a radiation-polymerizable layer comprised of the above-described composition.

Other objects, features and advantages of the present invention will become apparent to those skilled in the art from the following detailed description. It should be understood, however, that the detailed description and specific examples, while indicating preferred embodiments of the present invention, are given by way of illustration and not limitation. Many changes and modifications within the scope of the present invention may be made without departing from the spirit thereof, and the invention includes all such modifications.

DETAILED DESCRIPTION OF PREFERRED EMBODIMENTS

If, in the compound of the general formula I, more than one radical R or more than one radical of the type indicated in square brackets is bound to the central group Q, these radicals may be different from one another.

Compounds in which all substituents of Q are polymerizable radicals, i.e. in which m n, are generally preferred.

In general, a is 0 in not more than one radical, and a is preferably 1.

If R is an alkyl or hydroxyalkyl group, it generally has 2 to 8, preferably 2 to 4, carbon atoms. The aryl radical R may generally be mononuclear or dinuclear, preferably mononuclear, and optionally substituted by alkyl or alkoxy groups having up to 5 carbon atoms or by halogen atoms.

If $R^1$ and $R^2$ are alkyl or alkoxyalkyl groups, they may contain 1 to 5 carbon atoms.

$R^3$ is preferably a hydrogen atom or a methyl group, in particular a methyl group.

$D^1$ and $D^2$ may be identical or different and, together with the two nitrogen atoms, form a saturated heterocyclic ring having 5 to 10, preferably 6, ring members.

If E is an alkylene group, it preferably has 2 to 6 carbon atoms, and, as an arylene group, it is preferably a phenylene group. Preferred cycloaliphatic groups are cyclohexylene groups, and preferred aromatic heterocycles are those containing N or S as heteroatoms and having 5 or 6 ring members.

The polymerizable compounds of the formula I where Q=N and n=m are prepared by reacting glycidyl acrylate or alkacrylate with hydroxylalkylamines in a known manner. The reaction can be carried out analogously to the reaction, described in DE-A No. 2,927,933 or DE-B No. 1,800,462, of glycidyl(meth)acrylate with alcohols.

The hydroxyalkylamines used as starting materials are known or can be prepared analogously to known compounds. Examples are compounds which are produced by the addition reaction of ethylene oxide or higher alkylene oxides with ammonia or amines; for example triethanolamine, N-alkyl-N, N-di(hydroxyalkyl)amines, diethanolamine, tris-(2-hydroxypropyl)amine or tris-(2-hydroxybutyl)amine.

The preferred polymerizable compounds of the formula I where

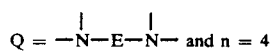

are prepared analogously to the polymerizable compounds where Q=N. The tetrahydroxyalkylalkylenediamines used as starting materials are known or can be prepared analogously to known compounds. Examples are compounds which are produced by the addition reaction of ethylene oxide or higher alkylene oxides with diamino compounds, for example with ethylenediamine and other alkylenediamines having up to 12, preferably up to 6, carbon atoms in the alkylene radical, p-phenylenediamine, benzidine, diaminopyridines, diaminopyrimidines and diaminopurines.

The polymerizable compounds of the formula I where

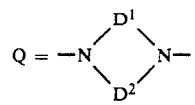

are prepared analogously to the above-described polymerizable compounds. The N-hydroxyalkylheterocyclic compounds used as starting materials are known or can be prepared analogously to known compounds. Examples are products of the reaction of ethylene oxide and piperazine, 1,4-diazacycloheptane or 1,10-diaza-4,7,13,16-tetraoxacyclooctadecane. In particular piperazine is employed since it is the simplest representative o this group of compounds.

An essential advantage of the compounds according to the invention is that they are responsible, in particular those where m=n, for the very high photosensitivity of the photopolymerizable mixtures obtained using them. A further advantage, in particular over the known structurally similar polymerizable compounds containing tertiary amino groups in the molecule, for example triethanolamine trimethacrylate, is the significantly lower tendency toward s diffusion or evaporation from photopolymerizable layers.

The compounds according to the invention can also be added with advantage to customary polymerizable compounds which contain two or more acrylate or methacrylate groups, it naturally being necessary to ensure that the above-mentioned advantages achieved by using the novel polymerizable compounds are not reduced too greatly by these compounds. Examples are acrylates and methacrylates of dihydric or polyhydric alcohols, such as ethylene glycol diacrylate, polyethylene glycol dimethacrylate, acrylates and methacrylates of trimethylolethane, trimethylolpropane, pentaerythritol and dipentaerythritol, and of polyhydric alicyclic alcohols.

The proportion of monomers in the coating is generally about 10 to 80, preferably 20 to 60%, by weight.

Binders which can be used are a large number of soluble organic polymers. Examples which may be mentioned are: polyamides, polyvinyl esters, polyvinyl acetals, polyvinyl ethers, epoxy resins, polyacrylates, polymethacrylates, polyesters, alkyd resins, polyacrylamide, polyvinyl alcohol, polyethylene oxide, polydimethylacrylamide, polyvinylpyrrolidone, polyvinylmethylformamide, polyvinylmethylacetamide, polybutadiene, polyisoprene, isoprene-styrene block copolymers and other elastomers, and also copolymers of the monomers which form the homopolymers listed.

It is also advantageous to use binders which are insoluble in water, but soluble, or at least swellable, in aqueous alkaline solutions since coatings containing such binders can be developed using aqueous alkaline developers. Such binders may contain, for example, the following groups: —COOH, —PO$_3$H$_2$, —SO$_3$H; —SO$_2$NH—, —SO$_2$—NH—SO$_2$ and —SO$_2$—NH—CO—.

Examples of these which may be mentioned are: maleate resins, polymers of β-(methacryloyloxy)ethyl N-(p-tolylsulfonyl)-carbamates and copolymers of these and similar monomers with other monomers, vinyl acetate/crotonic acid, styrene/maleic anhydride and alkyl methacrylate/methacrylic acid copolymers and copolymers of methacrylic acid, higher alkyl methacrylates and methyl methacrylate and/or styrene or acrylonitrile.

The amount of binder is generally 20 to 90, preferably 30 to 80%, by weight of the components of the coating.

Depending on the planned application and depending on the properties desired, the photopolymerizable mixtures may contain various substances as additives. Examples are: polymerization inhibitors, hydrogen donors, dyes, colored and non-colored pigments and plasticizers.

For the purposes of this description, actinic radiation is to be understood as any radiation whose energy corresponds at least to that of short-wave visible light. Visible light, long-wave and shortwave UV radiation, laser radiation, electron radiation and X-ray radiation, inter alia, are suitable.

A large number of substances can be used as photoinitiators in the mixture according to the invention. Examples are those which are derived from the parent structure of benzophenones, acetophenones, benzoins, benzils, benzil monoketals, fluorenone, thioxanthone, polynuclear quinones, acridines and quinoxalines; furthermore trichloromethyl-s-triazines, 2-halomethyl-5-vinyl-1,3,4-oxadiazole derivatives, halooxazoles which are substituted by trichloromethyl groups, carbonylmethylene heterocyclic compounds containing trihalomethyl groups, as in DE-A No. 3,333,450, or acylphosphine oxide compounds, as described, for example, in DE-A No. 3,133,419.

The initiators are generally employed in an amount from 0.01 to 10, preferably 0.05 to 4%, by weight, relative to the nonvolatile components of the mixture.

If imaging is carried out using electron beams, suitable photoinitiators, besides the known photoinitiators which are sensitive to visible and near UV light, are also those whose absorption regions are in the short-wave part of the electromagnetic spectrum and which are thus less sensitive to daylight. This has the advantage that the recording materials can be handled without excluding light and that the materials can be made to have a longer shelf life. Examples of initiators of this type which may be mentioned are tribromomethyl phenyl sulfone, 2,2',4,4',6,6'-hexabromodiphenylamine, pentabromoethane, 2,3,4,5-tetrachloroaniline, pentaerythritol tetrabromide, chloroterphenyl resins or chlorinated paraffins.

The photopolymerizable mixture can be used for various applications, for example for the production of paints which are cured by light, as a material for dental fillings or replacements and, in particular, as a photosensitive recording material in the reproduction field.

The detailed description of the invention is limited to this field of application, but the invention is not limited thereto. Possible applications which may be mentioned in this area are: recording layers for photomechanical production of printing plates for letterpress printing, particular flexographic printing, planographic printing, photogravure printing and screen printing, of relief copies, for example the production of braille texts, of individual copies, tanned images, pigmented images etc. Ir addition, the mixtures can be used for the photomechanical production of etch resists, for example for the production of nameplates, of printed circuits and for chemical milling. The mixtures according to the invention are of particular importance as copying layers for the photomechanical production of printing plates and for photoresist technology.

The mixture can be commercially utilized for the applications mentioned in the form of a liquid solution or dispersion, for example as a photoresist solution, which is applied by the processer himself to an individual base, for example for chemical milling, for the production of printed circuits, of screen-printing stencils and the like. The mixture can also be in the form of a solid photosensitive layer on a suitable base in the form of a storable, pre-coated, photosensitive copying material, for example for the production of printing plates. It is likewise suitable for the production of dry resist.

It is generally favorable to keep the mixtures away from the influence of atmospheric oxygen during the photopolymerization. When the mixture is used in the form of thin copying layers, it is advisable to apply a suitable, oxygen-impermeable covering film which can be removed mechanically or may be developer-soluble.

Suitable bases for copying materials produced using the mixture according to the invention are, for example, aluminum, steel, zinc, copper and plastic films, for example made from polyethylene terephthalate or cellulose acetate, and screen-printing bases, such as perlon gauze. It is in many cases favorable to subject the base surface to pretreatment (chemical or mechanical) with the aim of correctly setting the adhesion of the coating or reducing the reflectivity of the base in the actinic region of the copying layer (antihalation).

The production of the photosensitive materials using the mixture according to the invention takes place in a known manner. Thus, this mixture can be taken up in a solvent, and the solution or dispersion can be applied onto the intended base by pouring, spraying, dipping, roller application etc. and subsequently dried. Thick layers (for example of 250 $\mu$m and more) are advantageously produced by extrusion or press molding as a self-supporting film, which is then laminated, if desired, onto a base. In the case of dry resist, solutions of the mixture are applied to transparent bases and dried. The photosensitive layers—thickness between about 10 and 100 $\mu$m—are then likewise firstly laminated onto the desired substrate together with the temporary base.

The materials are processed in a known manner. For better crosslinking of the layer post-baking can take place after exposure. For development, they are treated with a suitable developer solution, for example with organic solvents, or with weakly alkaline aqueous solutions, the unexposed parts of the layer being removed and the exposed parts of the copying layer remaining on the base.

Illustrative embodiments of the invention are given below. In these, parts by weight (pbw) relate to parts by volume (pbv) as the g relates to the ccm. Percentages and quantities are taken to mean weight units, unless otherwise stated.

EXAMPLE 1

11.4 pbw of triethanolamine are dissolved in 60 pbv of butanone in a three-necked flask fitted with stirrer, reflux condenser and thermometer. 0.6 pbw of sodium is added to this solution with stirring. When the sodium has dissolved, 32.2 pbw of glycidyl methacrylate, dissolved in 40 pbv of butanone, are added dropwise over the course of 2 hours at a bath temperature of 60° C. After a further 2 hours at 60° C, the mixture is cooled to room temperature, and 0.2 pbw of 2,6-di-tert.-butyl-4-methylphenol is added. The mixture is washed by shaking with an amount of aqueous hydrochloric acid equivalent to the sodium. The solution is subsequently washed again by shaking twice with water, dried over sodium sulfate and evaporated on a rotary evaporator at 50.C.

Yield: 26.1 pbw

Analysis: N calc.: 2.43%; found: 2.4%

A solution of
- 3.92 pbw of the above-described product of the reaction of triethanolamine and glycidyl methacrylate,
- 3.92 pbw of a copolymer of methyl methacrylate and methacrylic acid having a mean molecular weight of 35,000 and an acid number of 86,
- 0.07 pbw of 9-phenylacridine,
- 0.084 pbw of the azo dye made from 2,4-dinitro-6-chlorobenzene diazonium salt and 2-methoxy-5-acetylamino-N-cyanoethyl-N-hydroxyethylaniline and
- 0.07 pbw of 4-dimethylamino-4,-methyldibenzal acetone in
- 51.4 pbv of butanone is stirred, filtered and spin-coated on a spin coater onto electrolytically roughened and anodized aluminum.

The plates are dried for 2 minutes at 90° C.; the layer weight is 3.5 g/m². After a covering layer has been applied, the photopolymer layer is exposed under a combined negative original comprising a continuous tone step wedge, line elements and 60- and 120-dot screen elements, using a 8 kW xenon lamp The exposed plate is developed for 1 minute in the following developer:
- 3 pbw of sodium metasilicate x 9 H2O,
- 0.03 pbw of the product of the reaction of coconut fatty amine and ethylene oxide, and
- 96.97 pbw of demineralized water.

The plate is then fixed with 1% strength phosphoric acid and subsequently inked with a black oil-based ink. A planographic printing plate with good resolution of the image areas is obtained.

EXAMPLE 2

A Solution of
- 12 pbw of a terpolymer made from n-hexyl methacrylate, methacrylic acid and styrene (60:30:10) with a mean molecular weight of 35,000 and an acid number of 195, 8 pbw of the product, described in Example 1, of the reaction of triethanolamine and glycidyl methacrylate,
- 0.2 pbw of the azo dye indicated in Example 1, and
- 0.2 pbw of 9-phenylacridine in
- 40 pbw of butanone is spin-coated onto a biaxially oriented and thermoset polyethylene terephthalate film of thickness 25 μm in the manner such that, after drying at 100° C., a layer thickness of 25 μm is obtained. A dry resist film is obtained which is laminated onto a phenoplastic laminate plate clad with a 35 μm thick copper foil using a commercially available laminator and exposed imagewise for 30 seconds using an 8 kW xenon lamp. The original used is a line original with line widths and separations down to 80 μm. After exposure the polyester film is removed and the coating is developed by spraying with a 1% strength sodium carbonate solution for 2 minutes. The plate is then dipped into a 15% strength ammonium peroxydisulfate solution at 50.C. The copper areas corresponding to the unexposed parts of the layer are removed by etching, and the remaining exposed layer is removed using trichloroethane, after which a perfect, negative copper image of the original is obtained.

EXAMPLE 3

23.6 pbw of N,N,N',N,-tetrakis-(2-hydroxyethyl)-ethylenediamine are dissolved in 150 pwb of butanone in a three-necked flask equipped with stirrer, reflux condenser and thermometer. 0.68 pwb of sodium is added to this solution with stirring. When the sodium has dissolved, 56.8 pbw of glycidyl methacrylate, dissolved in 70 pbw of butanone, are added dropwise over the course of 2 hours at a bath temperature of 60° C. After a further 2 hours at 60° C., the mixture is cooled to room temperature, and 0.3 pbw of 2,6-di-tert.-butyl-4-methylphenol is added. The mixture is washed by shaking with an amount of aqueous hydrochloric acid equivalent to the sodium. The mixture is subsequently again washed twice with 10% strength aqueous sodium carbonate solution and twice with water, dried over sodium sulfate and evaporated on a rotary evaporator at 50° C.

Yield: 52.3 pbw

Analysis: N content: calc.: 3.48% found: 3.7%

A dry resist film is produced analogously to Example 2 from a solution of
- 12 pbw of the terpolymer described in Example 2,
- 8 pbw of the above-described monomer,
- 0.2 pbw of 9-phenylacridine and
- 0.2 pbw of the azo dye indicated in Example 1 in
- 40 pbw of butanone and processed. A perfect negative copper image of the original is obtained.

EXAMPLE 4

14.9 pbw of triethanolamine are dissolved in 75 pbw of butanone in a three-necked flask equipped with stirrer, reflux condenser and thermometer. 0.76 pbw of sodium is added to this solution with stirring. When the sodium has dissolved, 127.9 pbw of glycidyl methacrylate, dissolved in 125 pbw of butanone, are added dropwise over the course of 2 hours at a bath temperature of 60° C. After a further 2 hours at 60° C., the mixture is cooled to room temperature, and 0.3 pbw of 2,6-di-tert.-butyl-4-methylphenol is added. The mixture is washed by shaking with an amount of aqueous hydrochloric acid equivalent to the sodium. The mixture is subsequently again washed by shaking twice with 10% strength aqueous sodium carbonate solution and twice with water, dried over sodium sulfate and evaporated on a rotary evaporator at 50° C.

Yield: 118.2 pbw

Analysis: N content calc.: 1.0% found: 1 2%

A photopolymerizable layer is produced analogously to Example 1 on aluminum at a layer weight of 3.7 g/m² using a solution comprising
- 3.92 pbw of the above-described product of the reaction of 1 mole of triethanolamine and 9 moles of glycidyl methacrylate,
- 3.92 pbw of the copolymer indicated in Example 1,
- 0.07 pbw of 9-phenylacridine,
- 0.084 pbw of the azo dye indicated in Example 1 and
- 0.07 pbw of 4-dimethylamino-4,methyldibenzal acetone in
- 51.4 pbv of butanone.

After exposure and development as in Example 1, a planographic printing plate with good resolution of the image areas is obtained.

EXAMPLE 5

A solution of 90 pbw of a styrene/isoprene/styrene three-block copolymer containing 15% of styrene,
8 pbw of the monomer described in Example 3,
2 pbw of benzil dimethyl ketal and
0.3 pbw of 2′6-di-tert.-butyl-4-methylphenol in
100 pbw of toluene is cast onto a 125 μm thick, biaxially oriented and thermoset polyester film using a metal frame to form a 6 mm thick layer After the toluene has evaporated, a 125 μm thick, biaxially oriented and thermoset polyester film provided with an adhesive coating is placed on the free surface of the 3 mm thick, solid photopolymer layer obtained, and the laminate element is pressed in a platen press for 5 minutes at 110° C. using spacers of thickness 2.7 mm. After the uncoated polyester film has been removed, the photopolymer layer is exposed through the remaining polyester film for 10 minutes without an original and then imagewise for 30 minutes from the free layer side using a commercially available UV-A flat-bed exposure apparatus (spectral range 320–400 nm: intensity of the UV-A scattered light 14 mW/cm$^2$). After the unexposed image areas have been washed out using tetrachloroethene, an elastic letterpress printing plate with good relief pattern (relief depth 1.5 mm) and a Shore A hardness of 48 is obtained.

EXAMPLE 6

19.1 pbw of triisopropanolamine are dissolved in 75 pbw of butanone in a three-necked flask equipped with stirrer, reflux condenser and thermometer. 0.78 pbw of sodium is added to this solution with stirring. When the sodium has dissolved, 42.7 pbw of glycidyl methacrylate, dissolved in 75 pbw of butanone, are added dropwise over the course of 2 hours at a bath temperature of 60° C. After a further 2 hours at 60° C., the mixture is cooled to room temperature, and 0.3 pbw of 2,6-di-tert.-butyl-4-methylphenol is added. The mixture is washed by shaking with an amount of aqueous hydrochloric acid equivalent to the sodium. The mixture is subsequently again washed by shaking twice with 10% strength aqueous sodium carbonate solution and twice with water, dried over sodium sulfate and evaporated on a rotary evaporator at 50° C.

Yield: 42.1 pbw

A photopolymer layer is produced as in Example 1 on aluminum at a layer weight of 3.7 g/m$^2$ using a solution comprising
  3.92 pbw of the above-described product of the reaction of triisopropanolamine and glycidyl methacrylate,
  3 92 pbw of the copolymer indicated in Example 1,
  0.07 pbw of 9-phenylacridine,
  0.084 pbw of the azo dye indicated in Example 1 and
  0.07 pbw of 4-dimethylamino-4,-methyldibenzal acetone in
  51.4 pbv of butanone.

After exposure and development analogously to Example 1, a planographic printing plate with good resolution of the image areas is obtained.

EXAMPLE 7

4.6 pbw of diethanolamine and 20 pbw of an epoxy resin made from bisphenol A and glycidyl chloride and having an epoxide equivalent weight of 455 (Beckopox EP 301) in 50 pbw of butanone are stirred for one hour at 60° C. in a three-necked flask equipped with stirrer, reflux condenser and thermometer. After 0.5 pbw of sodium hydride has been added, 12.5pbw of glycidyl methacrylate, dissolved in 20 pbw of butanone, are added dropwise, and the mixture is stirred for one hour at 60° C. After the mixture has been cooled to room temperature, 0.2 g of 2,6-di-tert.butyl-4-methylphenol and an amount of aqueous hydrochloric acid equivalent to the sodium hydride are added. The mixture is subsequently washed by shaking twice with 10% strength aqueous sodium carbonate solution and twice with water, dried over sodium sulfate and evaporated on a rotary evaporator at 50° C.

Yield: 24.1 pbw

A photopolymer layer is produced analogously to Example 1 on aluminum at a layer weight of 3.6 g/m$^2$ using a solution comprising
  3.92 pbw of the above-described product of the reaction of epoxy resin, diethanolamine and glycidyl methacrylate,
  3.92 pbw of the copolymer indicated in Example 1,
  0.07 pbw of 9-phenylacridine,
  0.084 pbw of the azo dye indicated in Example 1 and
  0.07 pbw of 4-dimethylamino-4,-methyldibenzal acetone in
  51.4 pbv of butanone.

After exposure and development as in Example 1, a planographic printing plate with good resolution of the image areas is obtained.

What is claimed is:

1. A radiation-polymerizable composition comprising
(a) a polymeric binder,
(b) a polymerizable compound of the formula

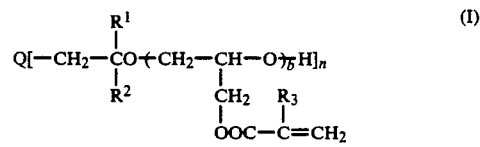

in which
Q denotes

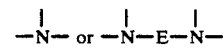

R$^1$ and R$^2$ are identical or different, and each denote a hydrogen atom, an alkyl group or an alkoxyalkyl group,
R$^3$ denotes a hydrogen atom, a methyl group or an ethyl group,
E denotes a saturated hydrocarbon group having 2 to 12 carbon atoms, a cycloaliphatic group having 5 to 7 ring members and which comprises zero to two N, O or S atoms as ring members, an arylene group having 6 to 12 carbon atoms, a heterocyclic aromatic group having 5 or 6 ring members or a group of the formula II

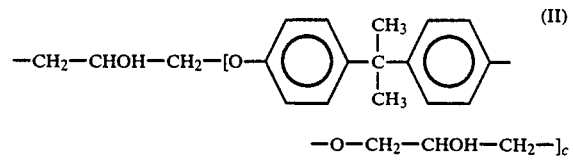

b denotes an integer from 1 to 4,
c denotes an integer from 1 to 3, and n denotes 3 or 4, depending on the valency of Q, where all radicals of the same definition may be identical to or different from one another, and (c) at least one compound capable of initiating polymerization of compound (b) under the action of actinic radiation.

2. A radiation-polymerizable composition as claimed in claim 1, consisting essentially of the recited ingredients.

3. A composition as claimed in claim 1, wherein E is a saturated alkylene group having 2 to 4 carbon atoms.

4. A composition as claimed in claim 1, wherein $R^3$ is $CH_3$.

5. A radiation-polymerizable composition as claimed in claim 1, wherein the binder is insoluble in water, but soluble or at least swellable in aqueous alkaline solutions.

6. A radiation-polymerizable mixture as claimed in claim 1, comprising, relative to the nonvolatile components of the mixture, from 10 to 80% by weight of compound (b), from 20 to 90% by weight of polymeric binder and from 0.01 to 10% by weight of at least one radiation-activatable polymerization initiator.

7. A radiation-polymerizable composition as claimed in claim 1, which further comprises a dye.

8. A radiation-polymerizable recording material which comprises a support and a radiation-polymerizable layer comprising a composition as claimed in claim 1.

9. A radiation-polymerizable recording material as claimed in claim 8, wherein said support has a surface comprising aluminum or copper.

10. A radiation-polymerizable recording material as claimed in claim 8, wherein said support has a surface comprising a plastic film.

11. A radiation-polymerizable recording material comprising a support and a radiation-polymerizable layer consisting essentially of a composition as claimed in claim 2.

* * * * *

UNITED STATES PATENT AND TRADEMARK OFFICE
CERTIFICATE OF CORRECTION

PATENT NO. : 4,987,053
DATED : January 22, 1991
INVENTOR(S) : Joachim Gersdorf, et. al.

It is certified that error appears in the above—identified patent and that said Letters Patent is hereby corrected as shown below:

On the Title page

[75] Inventors: Joachim Gersdorf; Klaus Rode, both of Wiesbaden, Fed. Rep. of Germany Col. 11, claim 6, line 3, delete "mixture" and insert --composition--.

Signed and Sealed this

Fifteenth Day of December, 1992

Attest:

DOUGLAS B. COMER

*Attesting Officer*  *Acting Commissioner of Patents and Trademarks*